(12) United States Patent
McVey

(10) Patent No.: US 6,421,397 B1
(45) Date of Patent: *Jul. 16, 2002

(54) MODULATION SYSTEM HAVING ON-LINE IQ CALIBRATION

(75) Inventor: James D. McVey, Palo Alto, CA (US)

(73) Assignee: Alcatel Canada Inc., Kanata (CA)

(*) Notice: Subject to any disclaimer, the term of this patent is extended or adjusted under 35 U.S.C. 154(b) by 0 days.

This patent is subject to a terminal disclaimer.

(21) Appl. No.: 09/493,733

(22) Filed: Jan. 28, 2000

(51) Int. Cl.[7] .............................................. H04L 27/20
(52) U.S. Cl. ...................... 375/308; 332/103; 332/145
(58) Field of Search ................................. 375/224, 279, 375/280, 281, 283, 308; 332/103, 144, 145; 330/149

(56) References Cited

U.S. PATENT DOCUMENTS

| | | | |
|---|---|---|---|
| 4,717,894 A | | 1/1988 | Edwards et al. .............. 332/20 |
| 5,119,399 A | | 6/1992 | Santo et al. ................. 375/224 |
| 5,341,423 A | * | 8/1994 | Nossen ........................ 380/252 |
| 5,371,481 A | * | 12/1994 | Tiittanen et al. ............. 332/103 |
| 5,450,043 A | * | 9/1995 | Tanaka et al. ............... 332/103 |
| 5,512,865 A | * | 4/1996 | Fague ......................... 332/103 |
| 5,900,778 A | * | 5/1999 | Stonick et al. .............. 330/149 |
| 6,014,065 A | * | 1/2000 | Nishikawa .................. 332/103 |
| 6,058,291 A | * | 5/2000 | Ketcham ..................... 455/46 |
| 6,246,286 B1 | * | 6/2001 | Persson ....................... 330/149 |

* cited by examiner

Primary Examiner—Young T. Tse
(74) Attorney, Agent, or Firm—Menlo Patent Agency LLC; David R. Gildea

(57) ABSTRACT

A modulation system having in-phase and quadrature phase (IQ) calibration while on-line. The modulation system includes digital filters for converting I and Q data bit streams into filtered multilevel I and Q digital data streams, digital-to-analog converters for converting the digital data streams from digital to analog form, and an IQ modulator for converting the analog I and Q data streams into a modulated output signal having a representative IQ diagram having modulation states and transition locations between the modulation states. The digital filters include forward shifting memories having several samples of the data bit streams for each data bit time. The system also includes an on-line correction data state detector, an IQ correction code, and a scalar amplitude detector. The on-line correction state detector monitors the data states in the memory and detects the presence of particular data states that are expected to result in particular modulation states or transition locations. The amplitude detector monitors the modulated output signal and provides representative detected magnitudes. When one of the particular data states is detected the IQ correction code is triggered to compare the detected magnitude with magnitudes for others of the particular data states that have been detected and stored previously. The IQ correction code then uses the comparison to generate adjustments for I and Q offsets, I/Q phase, and I/Q gain.

28 Claims, 5 Drawing Sheets

| | DATA STATES | | | | | | | | | | | | |
|---|---|---|---|---|---|---|---|---|---|---|---|---|---|
| | I1 | I2 | I3 | I4 | I5 | I6 | Q1 | Q2 | Q3 | Q4 | Q5 | Q6 | |
| MODULATION STATE (1,1) 56 | 1 | 1 | 1 | 1 | 1 | 1 | 1 | 1 | 1 | 1 | 1 | 1 | |
| MODULATION STATE (1,0) 57 | 1 | 1 | 0 | 1 | 1 | 0 | 0 | 0 | 0 | 0 | 0 | 0 | |
| MODULATION STATE (0,0) 58 | 0 | 0 | 0 | 0 | 0 | 0 | 1 | 1 | 0 | 0 | 0 | 0 | |
| MODULATION STATE (0,1) 59 | 0 | 0 | 0 | 0 | 0 | 0 | 0 | 0 | 1 | 1 | 1 | 1 | |
| TRANSITION LOCATION 62 | 1 | 1 | 1 | 1 | 1 | 1 | 0 | 0 | 0 | 1 | 1 | 1 | |
| TRANSITION LOCATION 63 | 1 | 1 | 1 | 1 | 1 | 1 | 1 | 1 | 1 | 0 | 0 | 0 | |
| TRANSITION LOCATION 64 | 0 | 0 | 0 | 1 | 1 | 1 | 0 | 0 | 0 | 0 | 0 | 0 | |
| TRANSITION LOCATION 65 | 1 | 1 | 1 | 0 | 0 | 0 | 0 | 0 | 0 | 0 | 0 | 0 | |
| TRANSITION LOCATION 66 | 0 | 0 | 0 | 0 | 0 | 0 | 1 | 1 | 1 | 1 | 1 | 1 | |
| TRANSITION LOCATION 67 | 0 | 0 | 0 | 1 | 1 | 1 | 1 | 1 | 1 | 1 | 1 | 1 | |
| TRANSITION LOCATION 68 | 1 | 1 | 1 | 0 | 0 | 0 | 1 | 1 | 1 | 0 | 0 | 0 | |
| TRANSITION LOCATION 69 | 1 | 1 | 1 | 1 | 1 | 1 | 1 | 1 | 0 | 0 | 0 | 0 | |

Fig. 5

MODULATION SYSTEM HAVING ON-LINE IQ CALIBRATION

BACKGROUND OF THE INVENTION

1. Field of the Invention

The invention relates generally to modulation systems and more particularly to an IQ modulation system using feedback for calibrating an IQ modulated output signal while the system is on-line.

2. Description of the Prior Art

In-phase (I) and quadrature phase (Q) modulators are commonly used for generating digital modulation such quadrature phase shift key (QPSK). QPSK is easily visualized in the IQ plane as an IQ diagram that is a square centered at the zero signal point and having modulation states at each of the corners. Many other common modulations, such as sixteen quadrature amplitude modulation (16 QAM), 64 QAM, and 256 QAM, are possible using basically the same IQ modulator by controlling the amplitude of I and Q data streams driving the modulator. Unbalanced formats, where the I modulation amplitude and the Q modulation are not equal, are also possible using the same IQ modulator.

Such IQ modulators are subject to several well-known errors. One error is due to carrier signal that leaks through the IQ modulator into the modulated output signal. The carrier leakage offsets the IQ diagram of the signal away from the zero signal point and is therefore sometimes termed an offset error. In general, the offset error has both an I offset error in the I dimension of the IQ plane and a Q offset error in the Q dimension of the IQ plane. Another error, termed quadrature error or I/Q phase error, occurs because the I modulation and the Q modulation from the IQ modulator are not exactly in quadrature. Another error, termed I/Q gain imbalance, occurs because the I modulation component and the Q modulation component from the IQ modulator do not have a desired ratio. For standard QPSK, 16 QAM, 64 QAM, and 256 QAM the desired ratio is one. However, unbalanced modulation formats having ratios other than one are possible.

Several approaches have been used for correcting the errors in IQ modulators. One approach is to observe the output of the IQ modulator on a vector network analyzer for certain test inputs while either adjusting parameters of the IQ modulator or adjusting the circuits driving the IQ modulator. Then, when the adjustments yield a satisfactory result, they are fixed in place and the IQ modulator is put into service. This approach has several disadvantages. Expensive test equipment is required. The parameters of the IQ modulator can drift causing the performance of the IQ modulator to degrade after the adjustments are fixed. And, the IQ modulator must be out of service while the calibration is performed. Another approach disclosed by Edwards et al. in U.S. Pat. No. 4,717,894 uses a scalar detector in place of the vector network analyzer. This approach eliminates the need for expensive test equipment. However, the Edwards approach also requires that the IQ modulator be out of service while it is being calibrated. It should be appreciated that a communication system cannot easily be taken off-line for calibration and adjustment.

There is a need for a modulation system that can be calibrated without taking the modulation system off-line.

SUMMARY OF THE INVENTION

It is therefore an object of the present invention to provide an apparatus and method using a scalar detector and feedback for on-line calibration of a modulation system.

Briefly, in a preferred embodiment, a modulation system of the present invention includes digital filters for converting in-phase (I) and quadrature phase (Q) data bit streams into filtered multilevel I and Q digital data streams, digital-to-analog converters for converting the data streams from digital to analog form, and an IQ modulator for converting the analog I and Q data streams into a modulated output signal that can be represented with an IQ diagram.

In order to reduce errors in the modulated output signal without talking the system off-line, the system also includes an on-line correction data state detector, an IQ correction code, and a scalar amplitude detector. Particular modulation states and transition locations of the IQ diagram are selected for consideration. The digital filters include forward shifting memories having several samples of the data bit streams for each data bit time. The data state detector monitors the samples in the memories, termed data states, and detects the presence of particular data states that are expected to provide the particular modulation states or transition locations. The amplitude detector monitors the modulated output signal and provides representative detected magnitudes. When one of the particular data states is detected the IQ correction code is triggered to receive the detected magnitude. The IQ correction code compares the detected magnitude to magnitudes that have been detected and stored previously and generates calibration adjustments from the comparisons for correcting errors in the modulated output signal.

The primary errors requiring correction are carrier leakage, termed I and Q offsets; deviation from quadrature between I and Q modulation, termed I/Q phase error; and amplitude imbalance between I and Q modulation, termed I/Q gain error. Several alternative embodiments can be used for applying the corrective adjustments. In preferred embodiments, I and Q offsets are corrected with I and Q offset adjustment summers in the paths of the I and Q digital or analog data streams for adjusting the balance of I and Q mixers in the IQ modulator. The I/Q phase error is corrected with an I/Q phase adjustment multiplier and summer for the I and Q digital date streams or with a phase shifters in the IQ modulator. The I/Q gain error is corrected with a I/Q gain adjustment multiplier in one or more of the data streams or with a multiplying digital-to-analog converter in one or both of the data streams.

An advantage of a modulation system the present invention is that the modulation system uses an inexpensive scalar detector for calibrating the modulated output signal without interrupting service.

These and other objects and advantages of the present invention will no doubt become obvious to those of ordinary skill in the art after having read the following detailed description of the preferred embodiments which are illustrated in the various figures.

BRIEF DESCRIPTION OF THE DRAWINGS

FIG. 5 is a table of particular data states that are used for the on-line error calibration of the modulation system of FIG. 1.

DETAILED DESCRIPTION OF THE PREFERRED EMBODIMENTS

Figure 1:
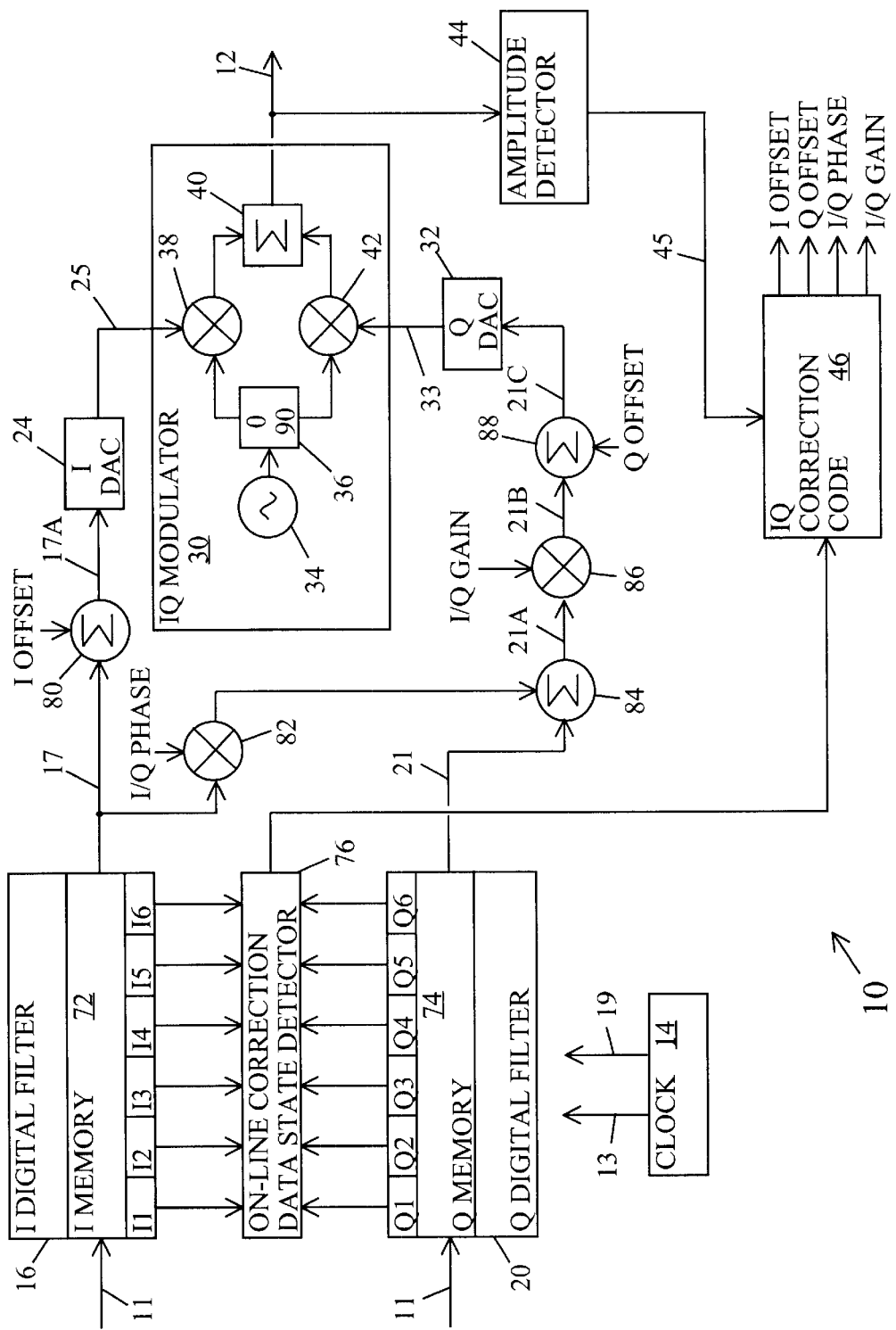
FIG. 1 is a block diagram of a modulation system of the present invention having on-line IQ error calibration.

FIG. 1 is a block diagram of a modulation system of the present invention referred to by the general reference number 10 for receiving data bits in a data stream input signal 11 and issuing a modulated output signal 12 having in-phase (I) and quadrature phase (Q) components. In a preferred embodiment, the input data bit stream 11 includes I and Q data bit streams carrying I and Q data bits, respectively. The I and Q data bit streams 11 are synchronized to a first clock signal 13 at a first clock rate from a clock 14. For a quadrature phase-shift key (QPSK) modulation format, the I and Q data bit streams 11 each carry one bit of data for each cycle of the first clock signal. For higher order modulation formats, the I and Q data streams 11 carry correspondingly higher numbers of bits of data. For example, the I and Q data streams 11 each carry two bits of data for sixteen quadrature amplitude modulation (16 QAM), three bits of data for sixty-four QAM, four bits of data for two-hundred fifty-six QAM, and so on, for each cycle of the first clock signal 13.

An I digital filter 16 filters the data bits in the I data bit stream 11 and issues a filtered multi-level I digital data stream 17 synchronized to a second clock signal 19 from the clock 14. The second clock signal 19 has a second clock rate of a multiple "N", for example four, times the first clock rate. Similarly, a Q digital filter 20 filters the data bits in the Q data bit stream 11 and issues a filtered multi-level Q digital data stream 21 synchronized to the second clock signal 19. Additional clock signals can be provided by the clock 14, for example, for operating the I and Q digital data streams 17,21 at different rates. The filtered I digital data stream 17 passes to an I digital-to-analog converter (DAC) 24 where the signal is converted from a multi-level digital form to an analog form and issued as an analog I data signal 25 to an IQ modulator 30. Similarly, the filtered Q digital data stream 21 passes to a Q digital-to-analog converter (DAC) 32 where the signal is converted from a multi-level digital form to an analog form and issued as an analog Q data signal 33 to the IQ modulator 30. The IQ modulator 30 uses the analog I and Q data signals 25,33 for providing the I and Q modulation components, respectively, for the modulated output signal 12.

The IQ modulator 30 includes an oscillator 34, a ninety degree splitter 36, an I mixer 38, a summer 40, and a Q mixer 42. The oscillator 34 generates a constant wavelength (CW) signal at the desired output frequency of the modulation system 10. The construction of such oscillator 34 using feedback and resonant circuitry is conventional. The CW signal is received by the ninety degree splitter 36 and split into an I CW signal and a Q CW signal where the Q CW signal is in quadrature with the I CW signal. The ninety degree phases splitter 36 can be constructed in a convention manner with quarter wave line lengths. Alternatively, the I and Q CW signals can be provided by an oscillator at four times the desired frequency and a divide-by-four dividers for providing the I and Q CW signals in quadrature phase. The I CW signal is received by the I mixer 38. The I mixer 38 modulates the I CW signal with the analog I data signal 25 and issues an I modulated signal to a summer 40. Similarly, the Q CW signal is received by the Q mixer 42. The Q mixer 42 modulates the Q CW signal with the analog Q data signal 33 and issues a Q modulated signal to the summer 40. Such I mixer 38 and Q mixer 42 can be constructed conventionally with transformers and diodes. The summer 40 combines the I modulated signal and the Q modulated signal for providing the modulated output signal 12. Construction of such summer 40 using resistors and/or quarter wave lines is well-known.

An amplitude detector 44 tracks and detects the magnitude of the modulated output signal 12 while the modulation system 10 is on-line and passes information for the detected on-line magnitude 45 to an IQ correction code 46. Such amplitude detector can be inexpensively constructed with a series diode and capacitor between the modulated output signal 12 and ground, and an analog-to-digital converter (ADC) having an input connected to the junction of the diode and capacitor and an output for issuing the detected magnitude 45 in a digital form. The capacitance of the capacitor is selected for being able to follow the frequency of the IQ modulation.

Figure 2:
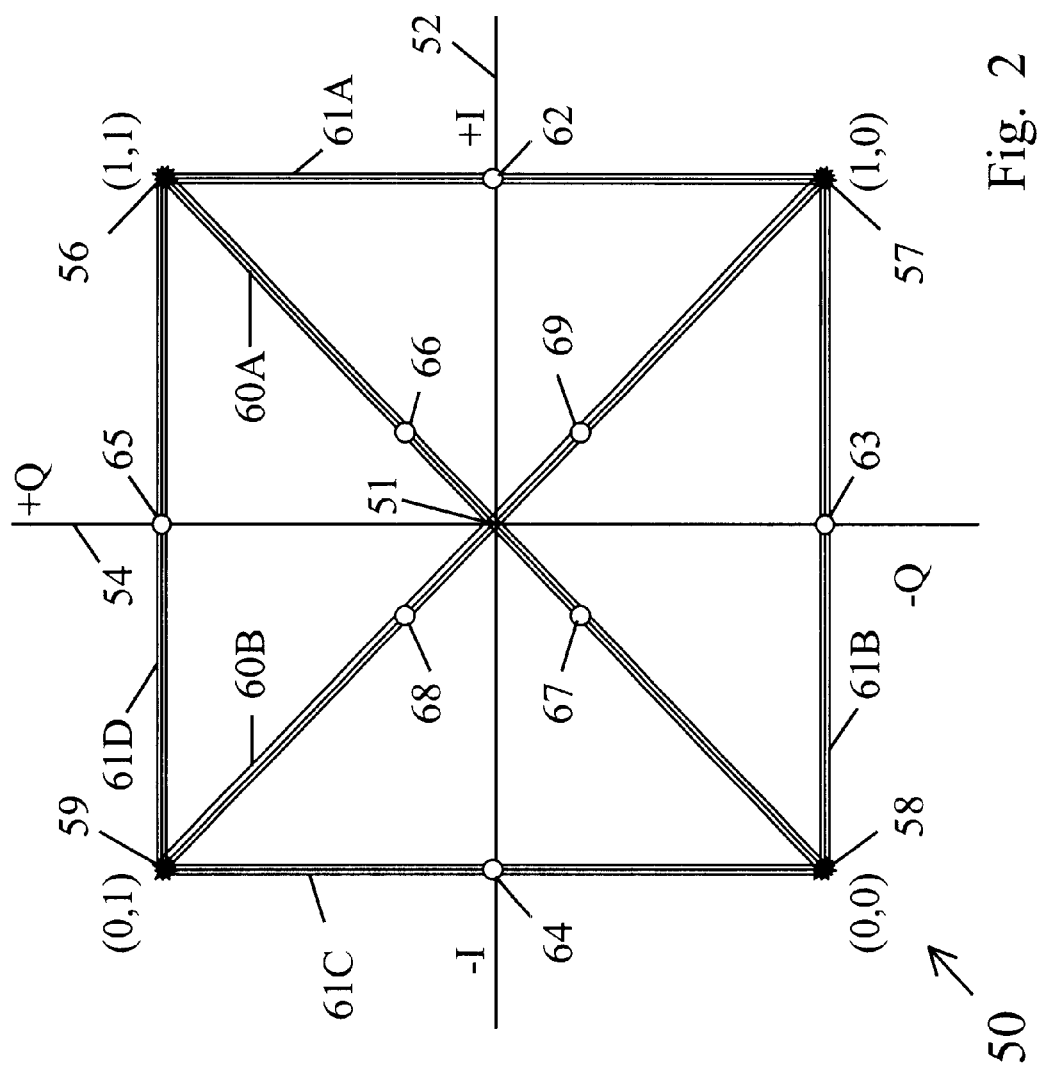
FIG. 2 is an IQ diagram of a modulated output signal issued by the modulation system of FIG. 1.

FIG. 2 illustrates an IQ diagram 50 of the modulated output signal 12. The IQ diagram 50 includes a zero signal point 51, an I axis 52 and a Q axis 54. The I modulation component shows as positive or negative displacements in the dimension of the I axis 52. Similarly, the Q modulation component shows as positive or negative displacements in the dimension of the Q axis-54. The I and Q modulation components combine for making the modulated output signal 12. For an exemplary modulation of QPSK, (I,Q) modulation states for the modulated output signal 12 are state (1,1) 56, state (1,0) 57, state (0,0) 58, and state (0,1) 59. Transition paths 60A–B and 61A–D of the modulated output signal 12 between the states 56–59 are shown as closely spaced multiple lines to indicate that the path trajectories in a real system are subject to variations by effects such as intersymbol inference. Transition paths 60A–B are expected to pass through or near to the zero signal point 51 when both the I modulation component and the Q modulation component change. Transition paths 61A–D connect the IQ modulation states 56–59 when only one of the I and Q modulation components changes. Certain pre-determined IQ locations along the transition paths 60A–B and 61A–D are selected for special consideration that will be described below. In a preferred embodiment, these IQ transition locations are as follows: Exterior transition location 62 on transition path 61A is mid way between state (1,1) 56 and state (1,0) 57. Exterior transition location 63 on transition path 61B is mid way between state (1,0) 57 and state (0,0) 58. Exterior transition location 64 on transition path 61C is mid way between state (0,0) 58 and state (0,1) 59. Exterior transition location 65 on transition path 61D is mid way between state (0,1) 59 and state (1,1) 56. Interior transition location 66 on transition path 60A is approximately two-thirds the way between state (0,0) 58 and state (1,1) 56. Interior transition location 67 on transition path 60A is approximately one-third the way between state (0,0) 58 and state (1,1) 56. Interior transition location 68 on transition path 60B is approximately two-thirds the way between state (1,0) 57 and state (0,1) 59. Interior transition location 69 on transition path 60B is approximately one-third the way between state (1,0) 57 and state (0,1) 59.

Continuing to use QPSK as the exemplary modulation format, ideally the IQ diagram 50 of the modulated output signal 12 is perfectly square and centered about the zero signal point 51. However, imperfections in the elements of the IQ modulator 30 cause the modulated output signal 12 to have several errors. The primary errors include CW carrier signal leakage, termed I and Q offsets; imbalance between the amplitudes of the I and Q modulation, termed to I/Q gain imbalance; and deviation from quadrature between the I modulation and the Q modulation, termed I/Q phase error. These errors typically are greater when the IQ modulator 30 operates at higher frequencies, for example microwave frequencies. The I and Q offsets cause the IQ diagram 50 to center about a point that is offset from the zero signal point 51 along the I axis 52 and the Q axis 54, respectively. The I and Q offsets can be positive or negative. The I/Q gain imbalance causes the IQ diagram 50 to be rectangular instead of square. The I/Q phase error causes the IQ diagram 50 to be a parallelogram. Isolators, attenuators, and/or amplifiers can be used in the signal paths between the various elements of the IQ modulator 30 to improve the matches between the elements in order to reduce second order errors.

Returning to FIG. 1, in order to compensate for the primary errors, the present invention applies corrective adjustments while the modulation system 10 is operationally on-line and providing the modulated output signal 12. The I digital filter 16 includes a forward shifting I memory 72 with a plurality of memory locations represented by I memory locations I1, I2, I3, I4, I5, and I6. The data bits from the I data stream input are received into the I memory 72 with the first clock signal 13 and then shifted through the I memory locations I1–I6 with the second clock signal 19. The filtered multi-level I digital data stream 17 is generated in the I digital filter 16 by multiplying the data bits from each of the I memory locations I1–I6 with respective pre-determined gains and then summing the products. Similarly, the Q digital filter 20 includes a forward shifting Q memory 74 with a plurality of memory location represented by Q memory locations Q1, Q2, Q3, Q4, Q5, and Q6. The data bits from the Q data stream input are received into the Q memory 74 with the first clock signal 13 and then shifted through the Q memory locations Q1–Q6 with the second clock signal 19. The filtered multi-level Q digital data stream 21 is generated by the Q digital filter 20 by multiplying the data bits from each of the Q memory locations Q1–Q6 with respective pre-determined gains and then summing the products. There can be more or less than six I memory locations I1–I6 in the I memory 72 and more or less than six Q memory location Q1–Q6 in the Q memory 74 depending upon the filtering that is required. A typical system 10 where clock signal 19 is at four times the rate of clock signal 13 might actually use twenty-four I memory locations and twenty-four Q memory locations.

The I memory locations I1–I6 and the Q memory locations Q1–Q6 represent a data state that is monitored by an on-line correction data state detector 76. The data state detector 76 detects when the data state matches pre-determined particular data states that correspond to particular (I,Q) modulation states 56–59 or transition locations 62–69 of the modulated output signal 12 represented in the IQ diagram 50 of FIG. 2. When a match is detected, the on-line-correction detector 76 issues a trigger signal having information indicative of the particular one of the (I,Q) modulation states 56–59 or transition locations 62–69 that is detected to the IQ correction code 46. Either the data state detector 76 delays the trigger signal or the IQ correction code 46 adds a time delay to match the time delay between data states in the I and Q memories 72 and 74, and the output of the detected magnitudes 45 from the amplitude detector 44. All the modulation states 56–59 have one expected magnitude. All the exterior transition locations 62–65 have a second expected magnitude. The interior transition locations 66–69 have a third expected magnitude. The expected magnitudes are stored and compared to the detected magnitudes 45 in order to detect and eliminate erroneous measurements.

The modulation system 10 includes an I offset adjustment summer 80, an I/Q phase adjustment multiplier 82, and I/Q phase adjustment summer 84, an I/Q balance adjustment multiplier 86, and a Q offset adjustment summer 88. The I offset adjustment summer 80 sums the I offset adjustment with the multi-level I digital data stream 17 and then passes an adjusted multi-level I digital data stream 17A to the I DAC 24. The I/Q phase adjustment multiplier 82 multiplies the multi-level I digital data stream 17 times the I/Q phase adjustment and passes the product to the I/Q phase adjustment summer 84. The I/Q phase adjustment summer 84 sums the product with the multi-level Q digital data stream 21 and passes an adjusted multi-level Q digital data stream 21A to the I/Q gain adjustment multiplier 86. The I/Q gain adjustment multiplier 86 multiplies the adjusted multi-level Q digital data stream 21A by the I/Q gain adjustment and passes the product as a second adjusted multi-level Q digital data stream 21B to the Q offset adjustment summer 88. The Q offset adjustment summer 88 sums the Q offset adjustment with the second adjusted multi-level Q digital data stream 21B and passes a third adjusted multi-level Q digital data stream 21C to the Q DAC 32. Preferably, the I/Q gain adjustment multiplier 86 adjusts for I/Q gain imbalance by adjusting the amplitude of the Q modulation component to equal to the amplitude of the I modulation component. Alternatively, separate gain multipliers can be used for adjusting the levels of both the I and Q digital data streams 17 and 21 in order to adjust the output signal power of the modulated output signal 12 to a selected level. In another alternative, the modulation system 10 can be designed so that I modulation is greater than Q modulation or vice versa by properly selecting the gain factors in the I digital filter 16 with respect to the Q digital filter 20 or the I DAC 24 with respect to the Q DAC 32 for providing a rectangular, non-square IQ diagram 50. Such unbalanced modulation is commonly used, as for example the L1 signal of the global positioning system. It will be appreciated by those of ordinary skill in the art that the adjustments described above to the I digital data stream 17 can, instead, be made on the Q digital data stream 21, while the adjustments described above to the Q digital data stream 21 are made on the I digital data stream 17.

In a preferred embodiment the clock 14, the I digital filter 16, the Q digital filter 20, the data state detector 76, the I offset adjustment summer 80, the I/Q phase adjustment multiplier 82, the I/Q phase adjustment summer 84, the I/Q gain adjustment multiplier 86, and the Q offset adjustment summer 88 are implemented in digital hardware. Preferably, the digital hardware is integrated. The IQ correction code 46 is stored in a memory that is coupled to a microprocessor. The microprocessor operates in a conventional manner for executing instructions in the IQ correction code 46 for computing and then issuing the I offset adjustment, the Q offset adjustment, the I/Q phase adjustment, and the I/Q gain adjustment as digital signals onto a signal bus that interconnects the digital hardware.

Figure 3:
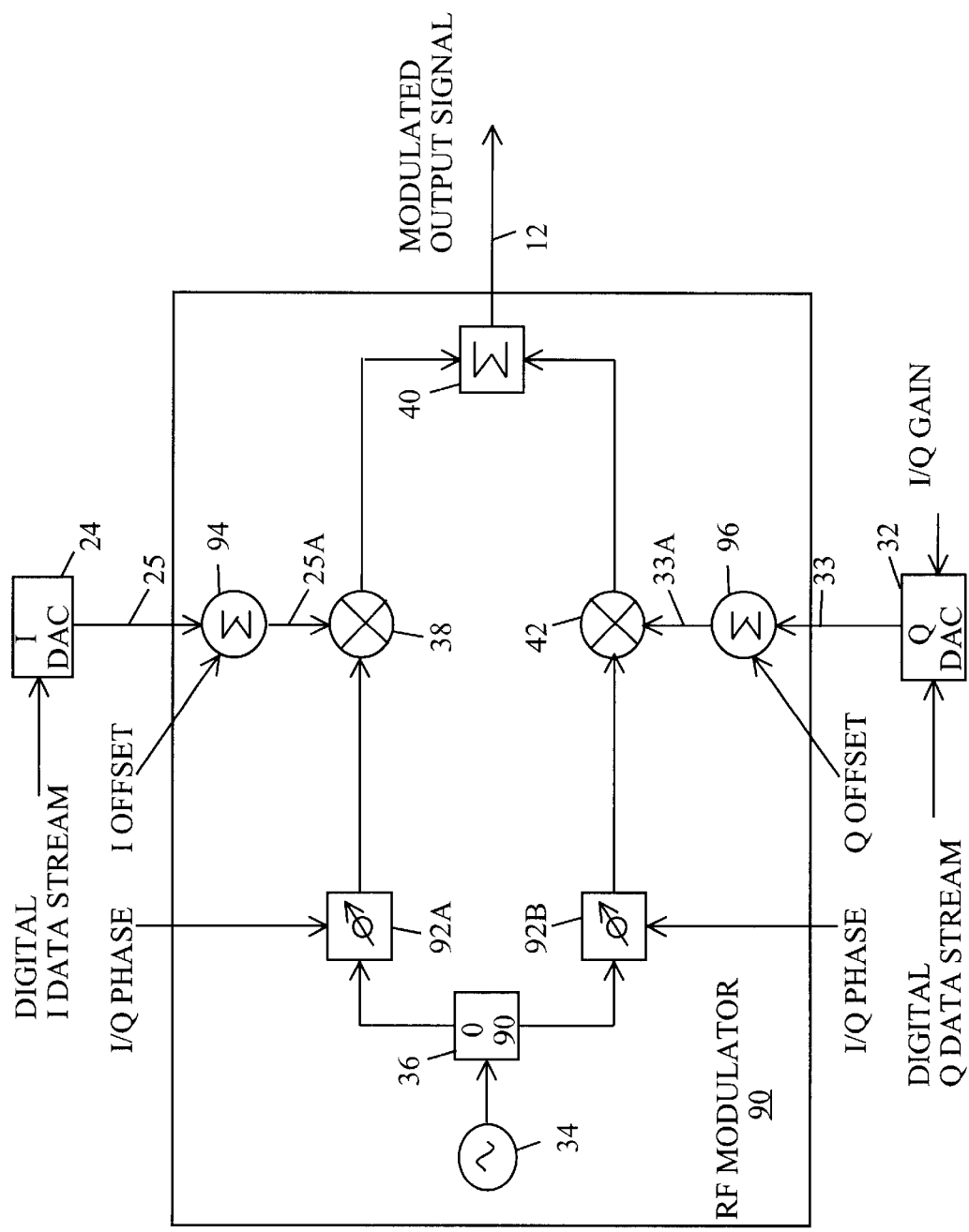
FIG. 3 is a block diagram of an alternative IQ modulator for the modulation system of FIG. 1.

FIG. 3 is a block diagram of an alternative IQ modulator 90 for the modulation system 10. The IQ modulator 90 includes the oscillator 34, the ninety degree splitter 36, the I mixer 38, the summer 40, and the Q mixer 42 as described above. The IQ modulator 90 also includes phase shifters 92A and 92B and bias summers 94 and 96. The oscillator 34 passes a CW signal to the ninety degree splitter 36. The ninety degree phase splitter 36 splits the CW signal into an I CW signal and a Q CW signal.

The phase shifters 92A and 92Q receive the I CW signal and the Q CW signal, respectively. The phase shifter 92A shifts the phase of the I CW signal according to the I/Q phase adjustment and passes the phase shifted I signal to the I mixer 38. Similarly, the phase shifter 92B shifts the phase of the Q CW signal according to the I/Q phase adjustment and passes the phase shifted Q signal to the Q mixer 42. Only one of the phase shifters 92A or 92B is required for adjusting for I/Q quadrature error. However, at higher frequencies, for example twelve gigahertz and above, it is preferable to use two phase shifters 92A and 92B for symmetry in order to reduce second order errors. For two phase shifters 92A and 92B, the I/Q phase adjustment includes A and B components so that as phase shifter 92A increases phase shift, the phase shifter 92B decreases shift phase and vice versa.

The bias summer 94 sums the I analog data 25 and a direct current (DC) signal for the I offset adjustment and passes adjusted I analog data 25A to the I mixer 38. Similarly, the bias summer 96 sums the Q analog data 33 and a direct current (DC) signal for the Q offset adjustment and passes the adjusted Q analog data 33A to the Q mixer 42. is The I offset adjustment adjusts the balance of the I mixer 38 in order to reduce the I CW signal that leaks through the I mixer 38 to the summer 40. Similarly, the Q offset adjustment adjusts the balance of the Q mixer 42 in order to reduce the Q CW signal that leaks through the Q mixer 42 to the summer 40.

The I mixer 38 modulates the phase shifted I CW signal with the adjusted analog I data signal 25A and issues a phase shifted I modulation component signal to the summer 40. Preferably, the Q DAC 32 is a multiplying DAC having a controlled variable ratio between the level of the input filtered multi-level Q digital data stream and the level of the output analog Q data signal 33 according to the I/Q gain adjustment. Alternatively, both the Q DAC 32 and the I DAC 24 can be multiplying DACs to set the output power of the modulated output signal 12. The Q mixer 42 modulates the phase shifted Q CW signal with the adjusted analog Q data signal 33A and issues a phase shifted Q modulation component signal to the summer 40. The summer 40 combines the I modulation component and the Q modulation component for providing the modulated output signal 12. Digital-to-analog converters (DAC)s can be used to convert the digital levels for the I and Q offset adjustments, I/Q phase adjustment, and I/Q gain adjustment to analog levels for the bias summers 94 and 96, phase shifter 92A,B, and Q DAC 32.

It is to be understood that the adjustment elements for the modulation system 10 shown in FIG. 1 for the IQ modulator 30 and in FIG. 3 for the IQ modulator 90 can be mixed. For example, the modulation system 10 can use the I and Q offset adjustment summers 80 and 88 and I/Q gain multiplier 86 together with the phase shifters 92A and 92B, or the I and Q offset adjustment summers 80 and 88 and the I/Q phase adjustment multiplier and summer 82 and 84 together with the I/Q gain adjustment Q DAC 32, and so on.

Figure 4:
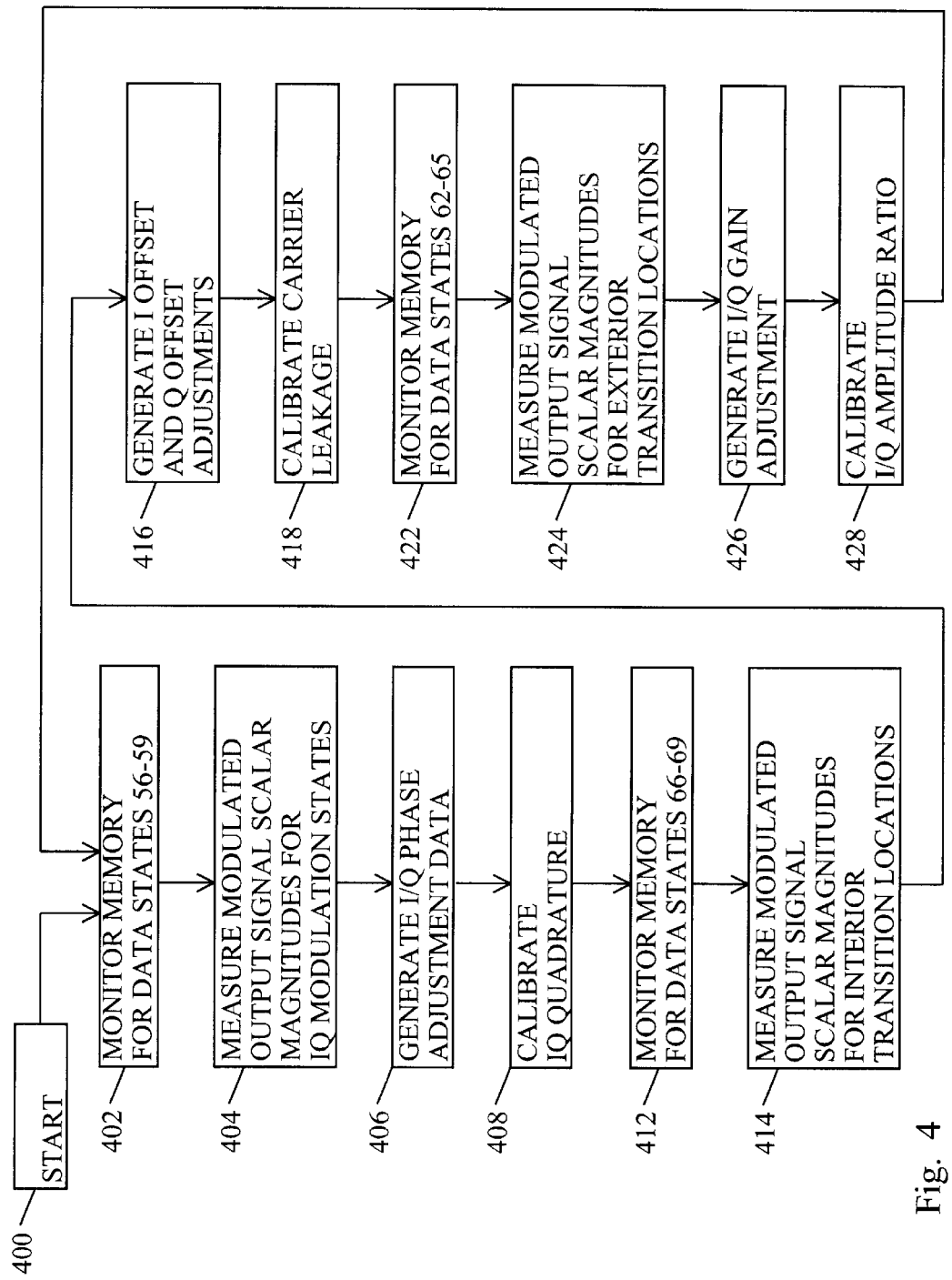
FIG. 4 is a flow chart of a calibration process for calibrating the modulation system of FIG. 1.

FIG. 4 is a flow chart of an iterative calibration process for correcting for the primary errors in the IQ modulator 30 or the IQ modulator 90. Briefly, the IQ correction code 46 uses the actual detected magnitudes 45 corresponding to the modulation states 56–59 for generating the I/Q phase adjustment for correcting quadrature error, the magnitudes 45 corresponding to the interior transition locations 66–69 for generating the I and Q offset adjustments for correcting carrier leakage, and the magnitudes 45 corresponding to the exterior transition locations 62–65 for generating the I/Q gain adjustment for correcting I/Q imbalance.

At the start 400, the modulation system 10 is on-line issuing the modulated output signal 12. The amplitude detector 44 is monitoring the magnitude of the modulated output signal 12, and the on-line correction data state detector 76 is monitoring the data states in the I and Q memories 72 and 74. The IQ correction code 46 stores a first default level for the modulation states 56–59, a second default level for the exterior transition locations 62–65, and a third default level for the interior transition locations 66–69.

In a step 402, the data state detector 76 detects monitors the I and Q memories 72 and 74 for the data states corresponding to the IQ modulation states 56–59 and issues the trigger signal having information indicative of the particular one of the IQ modulation states 56–59 that is detected. In a step 404 the trigger signal is used to key the IQ correction code 46 to receive the magnitude 45. The step 404 is repeated until the magnitudes 45 have been received several times for each of the IQ modulation states 56–59 and the average of the magnitudes 45 for each of the respective modulation states 56–59 is computed. In a step 406 the I/Q correction code 46 generates the I/Q phase adjustment to equalize the sum of the average of the magnitudes 45 for the modulation state 56 and the average of the magnitudes 45 for the modulation state 58 is to the sum of the average of the magnitudes 45 for the modulation state 57 and the average of the magnitudes 45 for the modulation state 59. Then, in a step 408 the I/Q phase adjustment data is used for calibrating I/Q phase (quadrature) error between the I modulation component and the Q modulation component.

In a step 412 the data state detector 76 monitors the I and Q memories 72 and 74 for the data states corresponding to the interior transition locations 66–69 and issues the trigger signal having information indicative of the particular one of the locations 66–69 that is detected. In a step 414 the trigger signal is used to key the IQ correction code 46 to receive the magnitude 45. The step 414 is repeated until the magnitudes 45 have been received several times for each of the interior transition locations 66–69 and the average of the magnitudes 45 for each of the respective locations 66–69 is computed. In a step 416 the I and Q offset adjustments are generated to equalize averages of the magnitudes 45 for the respective locations 66–69. Then, in a step 418 the I and Q offset adjustment data is used for calibrating for carrier leakage.

In a step 422 the data state detector 76 monitors the I and Q memories 72 and 74 for the data states corresponding to the exterior transition locations 62–65 and issues the trigger signal having information indicative of the particular one of the locations 62–65 that is detected. In a step 424 the trigger signal is used to key the IQ correction code 46 to receive the magnitude 45. The step 424 is repeated until the magnitudes 45 have been received several times for each of the exterior transition locations 62–65 and the average of the magnitudes 45 for each of the respective locations 62–65 is computed. In a step 426 the I/Q gain adjustment is generated to equalize the sum of the average of the magnitudes 45 for the modulation state 62 and the average of the magnitudes 45 for the modulation state 64 is to the sum of the average of the magnitudes 45 for the modulation state 63 and the average of the magnitudes 45 for the modulation state 65. Then, in a step 428 the I and Q gain adjustment data is used for calibrating for the ratio of the amplitudes between the I modulation component and the Q modulation component.

The method then returns to the step 402 to repeat the steps 402–428 in a continuous manner. Further details of the iterative calibration process illustrated in FIG. 4 and described above are taught by Edwards et al. in U.S. Pat. No. 4,717,894 entitled "Calibration of Vector Modulator Using a Scalar Detector" incorporated herein by reference.

In an alternative non-iterative calibration process, the IQ correction code 46 stores a first default magnitude level for the modulation state 56–59 and a second default magnitude level for the exterior transition locations 62–65. The on-line correction state detector 76 monitors the I and Q memories 72 and 74 for the data states corresponding to the IQ modulation states 56–59 and the exterior transition locations 62–65. When one of these data states is detected, the data states detected. The IQ correction code 46 uses the trigger signal as a key to read the detected magnitude 45 for the modulated output signal 12 and compute and store corresponding magnitude levels. A continuous average is maintained for each of the magnitude levels. The IQ correction code 46 then uses the averaged magnitude levels for computing overdetermined solutions for the I and Q offset adjustments and I/Q phase and gain adjustments. Details of the non-iterative calibration process described above are taught by Santos et al. in U.S. Pat. No. 5,119,366 entitled "Quadrature Measurement and Calibration of a Vector Modulator" incorporated herein by reference. Preferably, in the method described by Santos et al. the amplitude detector 44 (FIG. 1) includes an analog-to-digital converter (ADC) constructed to compensate for the characteristics of a detector diode so that the output of the ADC is linearly proportional to the magnitude of the modulated output signal 12.

FIG. 5 is a table of the particular data states that are used by the on-line correction data state detector 76 for triggering the IQ correction code 46, and the corresponding modulation states 56–59 and transition locations 62–69. For example, the modulation state (1,1) 56 corresponds to the data state 1,1,1,1,1,1,1,1,1,1,1,1. Each of the transition locations 62–69 corresponds to two associated data states I1–6, Q1–6 because the locations 62–69 can be traversed from either of two directions. For example, the transition location 62 is corresponds to the data state 1,1,1,1,1,1,0,0,0,1,1,1 for the transition path 61A in the direction from modulation state (1,1) 56 to modulation state (1,0) 57 and to the data state 1,1,1,1,1,1,1,1,0,0,0 for the transition path 61A in the direction from modulation state (1,0) 57 to modulation state (1,1) 56.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A modulation system for providing a modulated output signal in response to an input data bit stream, comprising:
    a scalar amplitude detector for detecting magnitudes of said modulated output signal while said modulated output signal is on-line;
    an on-line correction data state detector for monitoring data states representative of said input data bit stream and detecting when particular ones of said data states occur; and
    a correction code coupled to the on-line correction data state detector for comparing particular ones of said detected magnitudes corresponding respectively to said particular data states and issuing adjustment information based upon said comparison for calibrating said modulated output signal without interrupting on-line operation of said modulated output signal.

2. The modulation system of claim 1, wherein:
    said modulated output signal includes IQ modulation states having in-phase (I) and quadrature phase (Q) modulation components and particular transition locations between said IQ modulation states in response to said particular data states; and
    said particular detected magnitudes include magnitudes representative of said modulated output signal at said particular transition locations.

3. The modulation system of claim 2, wherein:
    said particular transition locations include locations on a transition path expected to pass near to a zero magnitude signal point for said modulated output signal.

4. The modulated system of claim 2, wherein:
    said particular transition locations include locations on a transition path between two of said IQ modulation states where one of said I and Q modulation components is the same for each of said two IQ modulation states.

5. The modulation system of claim 1, further comprising:
    a filter including a memory coupled to the data state detector, the filter for receiving said data bit stream, converting said data bit stream to said data states, storing said data states in said memory, and generating a filtered multilevel digital data stream based upon said data states; and wherein:
    said modulated output signal is responsive to said digital data stream.

6. The modulation system of claim 5, wherein:
    said data bit stream includes an in-phase (I) data bit stream and a quadrature phase (Q) data bit stream; said memory includes an I memory and a Q memory; said data states include I data states stored in said I memory and Q data states stored in said Q memory; and said digital data stream includes an I digital data stream based upon said I data states and a Q digital data stream based upon said Q data states; and further comprising:
    an IQ modulator for issuing said modulated output signal having IQ modulation states having in-phase (I) and quadrature phase (Q) modulation components in response to said I and Q digital data streams.

7. The modulation system of claim 6, wherein:
    said adjustment information includes an I offset adjustment for calibrating said modulated output signal by reducing carrier leakage in said I modulation component and a Q offset adjustment for calibrating said modulated output signal by reducing carrier leakage in said Q modulation component.

8. The modulation system of claim 7, further comprising:
    an I offset summer for using said I offset adjustment for offsetting level of said I digital data stream; and
    a Q offset summer for using said Q offset adjustment for offsetting level of said Q digital data stream.

9. The modulation system of claim 7, wherein:
    the IQ modulator includes a mixer for receiving an I analog data stream responsive to said I offset adjustment and said I digital data stream, and responsively issuing said I modulation component; and a Q mixer for receiving a Q analog data stream responsive to said Q offset adjustment and said Q digital data stream, and responsively issuing said Q modulation component.

10. The modulation system of claim 6, wherein:
    said modulated output signal includes an I modulation component and a Q modulation component; and
    said adjustment information includes an I/Q phase adjustment for calibrating said modulated output signal by reducing quadrature error between said I modulation component and said Q modulation component.

11. The modulation system of claim 10, further comprising:
- an I/Q phase adjustment multiplier for multiplying said I/Q phase adjustment times one of said I digital data stream and said Q digital data stream for providing a product signal; and
- an I/Q phase adjustment summer for offsetting a level of the other of said I digital data stream and said Q digital data stream with said product signal.

12. The modulation system of claim 10, wherein:
the IQ modulator includes at least one of an I phase shifter for using said I/Q phase adjustment for phase shifting an I CW signal by an I phase shift and passing a phase shifted I CW signal to an I mixer and a Q phase shifter for using said I/Q phase adjustment for phase shifting a Q CW signal by a Q phase shift and passing a phase shifted Q CW signal to a Q mixer; said I mixer for issuing said I modulation component; and said Q mixer for issuing said Q modulation component.

13. The modulation system of claim 5, wherein:
said modulated output signal includes an I modulation component and a Q modulation component; and
said adjustment information includes an I/Q gain adjustment for calibrating said modulated output signal by reducing an amplitude ratio error between said I modulation component and said Q modulation component.

14. The modulation system of claim 13, further comprising:
an I/Q gain adjustment multiplier for multiplying said I/Q gain adjustment times one of said I digital data stream and said Q digital data stream.

15. A method for providing a modulated output signal in response to an input data bit stream, comprising steps of:
- detecting scalar magnitudes of said modulated output signal while said modulated output signal is on-line;
- monitoring data states representative of said input data bit stream;
- detecting when particular ones of said data states occur;
- comparing particular ones of said scalar magnitudes corresponding respectively to said particular data states to one another;
- issuing adjustment information based upon said comparisons; and
- calibrating said modulated output signal with said adjustment information without interrupting on-line operation of the modulated output signal.

16. The method of claim 15, further comprising steps of:
in response to said particular data states, driving said modulated output signal to IQ modulation states having in-phase (I) and quadrature phase (Q) modulation components and particular transition locations between said IQ modulation states; and wherein:
said particular scalar magnitudes are representative of said modulated output signal at said particular transition locations.

17. The method of claim 16, wherein:
said particular transition locations include locations on a transition path expected to pass near a zero magnitude signal point for said modulated output signal.

18. The method of claim 16, wherein:
said particular transition locations include locations on a transition path between two of said IQ modulation states where one of said I and Q modulation components is the same for each of said two IQ modulation states.

19. The method of claim 15, further comprising steps of:
receiving said input data bit stream;
converting said data bit stream to said data states;
storing said data states in a memory;
generating a filtered multilevel digital data stream based upon said data states; and
issuing said modulated output signal in response to said digital data stream.

20. The method of claim 19, wherein:
said input data bit stream includes an in-phase (I) data bit stream and a quadrature phase (Q) data bit stream; said memory includes an I memory and a Q memory; said data states include I data states stored in said I memory and Q data states stored in said Q memory; and said digital data stream includes an I digital data stream based upon said I data states and a Q digital data stream based upon said Q data states; and further comprising a step of:
issuing said modulated output signal having IQ modulation states having in-phase (I) and quadrature phase (Q) modulation components in response to said I and Q digital data streams.

21. The method of claim 20, wherein:
said adjustment information includes an I offset adjustment and a Q offset adjustment; and
the step of calibrating said modulated output signal includes steps of using said I offset adjustment for reducing carrier leakage in said I modulation component and using said Q offset adjustment for reducing carrier leakage in said Q modulation component.

22. The method of claim 21, wherein:
said step of using said I offset adjustment includes summing said I offset adjustment with said I digital data stream for offsetting level of said I digital data stream; and
said step of using said Q offset adjustment includes summing said Q offset adjustment with said Q digital data stream.

23. The method of claim 21, further comprising steps of:
receiving an I analog data stream responsive to said I offset adjustment and said I digital data stream in an I mixer and responsively issuing said I modulation component from said I mixer; and
receiving a Q analog data stream responsive to said Q offset adjustment and said Q digital data stream in a Q mixer and responsively issuing said Q modulation component.

24. The method of claim 19, wherein:
said modulated output signal includes an I modulation component and a Q modulation component; and
said adjustment information includes an I/Q phase adjustment; and
the step of calibrating said modulated output signal includes a step of using said I/Q phase adjustment for reducing quadrature error between said I modulation component and said Q modulation component.

25. The method of claim 24, wherein:
said step of using said I/Q phase adjustment includes steps of: multiplying said I/Q phase adjustment times one of said I multilevel digital data stream and said Q multilevel digital data stream for providing a product signal and offsetting a level of the other of said Q digital data stream and said I digital data stream with said product signal.

26. The method of claim 24, wherein:

said step of using said I/Q phase adjustment includes steps of: phase shifting at least one of an I CW signal with an I phase shift based upon said I/Q phase adjustment and a Q CW signal with a Q phase shift based upon said I/Q phase adjustment; receiving said at least one of said phase shifted I CW signal and said phase shifted Q CW signal in an I mixer for issuing said I modulated component and a Q mixer for issuing said Q modulation component, espectively.

27. The method of claim 19, wherein:

said modulated output signal includes an I modulation component and a Q modulation component;

said adjustment information includes an I/Q gain adjustment; and the step of calibrating said modulated output signal includes a step of using said I/Q gain adjustment for reducing an amplitude ratio error between said I modulation component and said Q modulation component.

28. The method of claim 27, wherein:

the step of using said I/Q gain adjustment includes multiplying said I/Q gain adjustment times one of said I digital data stream and said Q digital data stream.

* * * * *